United States Patent
Merrell et al.

(10) Patent No.: US 11,617,275 B2
(45) Date of Patent: Mar. 28, 2023

(54) WALL MOUNTED UTILITY CABINET

(71) Applicant: Hubbell Incorporated, Shelton, CT (US)

(72) Inventors: Richard James Merrell, New Haven, CT (US); Donald Wayne Nicholas, III, Staunton, IL (US); David Roy Harms, Marissa, IL (US); Matthew David Raetz, Belleville, IL (US); Marjana Marovic Abby, Carolina, RI (US)

(73) Assignee: Hubbell Incorporated, Shelton, CT (US)

(*) Notice: Subject to any disclaimer, the term of this patent is extended or adjusted under 35 U.S.C. 154(b) by 10 days.

(21) Appl. No.: 17/473,263

(22) Filed: Sep. 13, 2021

(65) Prior Publication Data
US 2022/0015248 A1    Jan. 13, 2022

Related U.S. Application Data

(63) Continuation of application No. 16/791,542, filed on Feb. 14, 2020, now Pat. No. 11,122,701.

(60) Provisional application No. 62/806,461, filed on Feb. 15, 2019.

(51) Int. Cl.
*H05K 5/02* (2006.01)

(52) U.S. Cl.
CPC ......... *H05K 5/0204* (2013.01); *H05K 5/0221* (2013.01); *H05K 5/0247* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,462,779 | B2* | 12/2008 | Caveney | H01R 9/2416 248/68.1 |
| 7,592,543 | B2* | 9/2009 | Caveney | H01R 9/2416 248/68.1 |
| 7,795,532 | B2 | 9/2010 | Walker | |
| 7,816,602 | B2 | 10/2010 | Landry | |
| 7,952,023 | B2* | 5/2011 | Caveney | H01R 9/2416 248/68.1 |
| 8,091,969 | B2* | 1/2012 | Caveney | H04Q 1/035 312/248 |
| 8,143,519 | B2 | 3/2012 | Puccini | |

(Continued)

OTHER PUBLICATIONS

PCT/US2020/018314 International Search Report and Written Opinion dated Jun. 26, 2020 (13 pages).

*Primary Examiner* — Lisa Lea-Edmonds
(74) *Attorney, Agent, or Firm* — Robinson & Cole LLP

(57) ABSTRACT

A utility cabinet includes a housing having an interior compartment, a rear wall, a top wall, a bottom wall, a first side wall, a second side wall, a front opening, and a side opening. A frame is connected to the housing and moveable between a first position where the frame is entirely in the housing and a second position where at least a portion of the frame is outside of the housing. The frame is configured to receive one or more utility components. A front door is connected to the housing and moveable between a closed position covering the front opening and an open position providing access to the front opening. A side door is connected to the housing and moveable between a closed position covering the side opening and an open position providing access to the side opening.

20 Claims, 5 Drawing Sheets

(56) References Cited

U.S. PATENT DOCUMENTS

| | | | |
|---|---|---|---|
| 8,153,893 B2 | 4/2012 | McSorley | |
| 8,263,861 B2* | 9/2012 | Landry | G02B 6/4471 |
| | | | 174/520 |
| 8,395,046 B2 | 3/2013 | Nicewicz | |
| 8,767,380 B2 | 7/2014 | Masterson | |
| 8,901,418 B2 | 12/2014 | Walker | |
| 8,908,356 B2 | 12/2014 | Wang | |
| 9,992,557 B2* | 6/2018 | Merrell | H04Q 1/09 |
| 10,104,798 B2* | 10/2018 | AbuGhazaleh | H05K 7/18 |
| 2005/0179348 A1* | 8/2005 | Caveney | H04Q 1/025 |
| | | | 312/248 |
| 2008/0068798 A1 | 3/2008 | Hendrix | |
| 2009/0021925 A1 | 1/2009 | Heimann | |
| 2013/0266283 A1 | 10/2013 | Baldassano | |
| 2013/0342091 A1 | 12/2013 | Walker et al. | |
| 2015/0282373 A1* | 10/2015 | AbuGhazaleh | H05K 7/1488 |
| | | | 312/273 |
| 2016/0029497 A1 | 1/2016 | Guo et al. | |
| 2017/0020025 A1* | 1/2017 | Huang | H05K 7/186 |
| 2017/0150632 A1* | 5/2017 | Merrell | H04Q 1/09 |
| 2017/0150636 A1* | 5/2017 | Segroves | H05K 7/14 |
| 2020/0317147 A1* | 10/2020 | Sainclivier | H05K 5/0073 |

\* cited by examiner

WALL MOUNTED UTILITY CABINET

RELATED APPLICATION(S)

This application is a continuation of U.S. application Ser. No. 16/791,542, filed Feb. 14, 2020, which is based on U.S. Provisional Application Ser. No. 62/806,461, filed Feb. 15, 2019, the disclosures of which are incorporated herein by reference in their entirety and to which priority is claimed.

FIELD

Various exemplary embodiments relate to a utility cabinet configured to be mounted to a wall and contain utility connections such as data and communication connections.

BACKGROUND

The organization and management of utility connections, for example voice and data connections, in building and office environments involves providing interconnect or patch panel assemblies in or near work areas. These panel assemblies establish connection points for both horizontal and vertical runs of cables. The connection points can be used to connect other panel assembles or provide routing to work stations using patch cords. Panel assemblies further facilitate termination points between cables and patch cords that are not in use, or need to be available, due to work station reconfigurations. In certain locations, panel assemblies are housed in cabinets that provide an enclosure to connections while allowing access to user.

SUMMARY

According to certain embodiments, a utility cabinet includes a housing having an interior compartment, a front opening, and a side opening. The housing is configured to be connected to a support structure. A frame is connected to the housing. A front door is connected to the housing and provides access to the interior compartment. A side door connected to the housing and provides access to the interior compartment. The frame is configured to receive a patch panel that includes an outgoing portion facing the front door and an incoming portion positioned opposite the outgoing portion.

According to certain embodiments, a utility cabinet includes a housing having an interior compartment and a front opening providing access to the interior compartment. The housing is configured to be connected to a support. A frame is connected to the housing and moveable between a first position where the frame is entirely in the housing and a second position where at least a portion of the frame is outside of the housing. A patch panel is connected to the frame, the patch panel having an outgoing portion facing the front opening and an incoming portion positioned opposite the outgoing portion.

According to certain embodiments, a utility cabinet includes a housing having an interior compartment, a rear wall, a top wall, a bottom wall, a first side wall, a second side wall, a front opening, and a side opening. The housing is configured to be connected to a support structure. A frame is connected to the housing and moveable between a first position where the frame is entirely in the housing and a second position where at least a portion of the frame is outside of the housing. The frame is configured to receive one or more utility components. A front door is connected to the housing and moveable between a closed position covering the front opening and an open position providing access to the front opening. A side door is connected to the housing and moveable between a closed position covering the side opening and an open position providing access to the side opening.

BRIEF DESCRIPTION OF THE DRAWINGS

The aspects and features of various exemplary embodiments will be more apparent from the description of those exemplary embodiments taken with reference to the accompanying drawings.

DETAILED DESCRIPTION OF EXEMPLARY EMBODIMENTS

Figure 1:
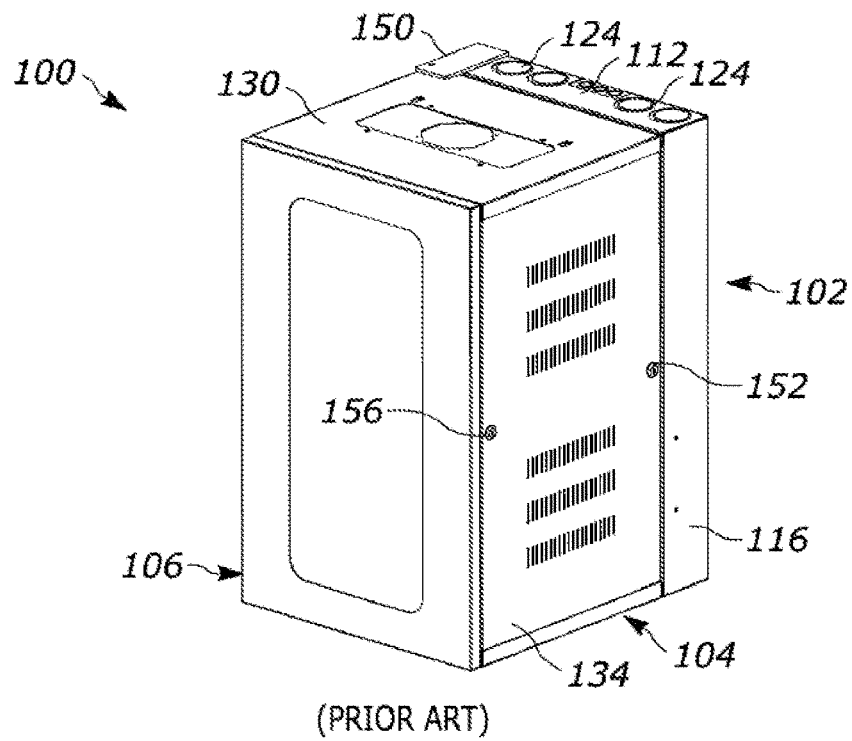
FIG. 1 is a perspective view of a traditional wall mounted utility cabinet.
Figure 2:
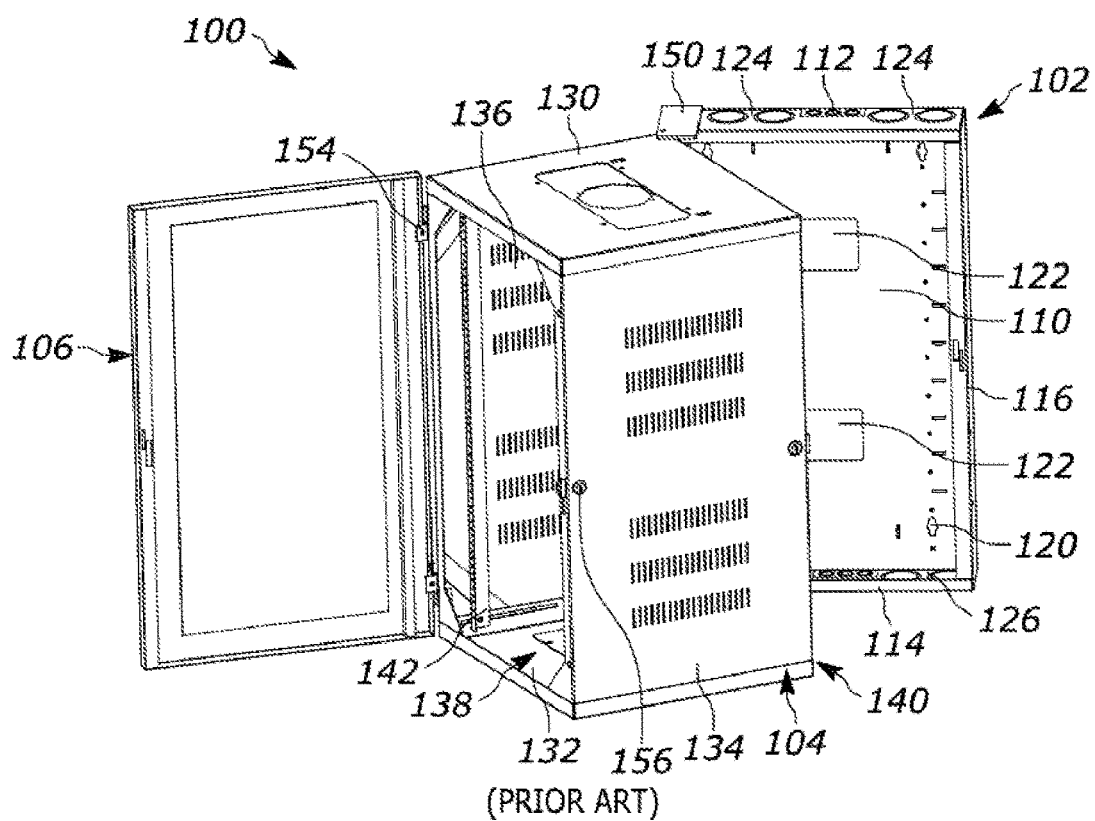
FIG. 2 is a perspective view of the cabinet of FIG. 1 in the open position.

FIGS. 1 and 2 show a wall mounted utility cabinet 100 that includes a rear door 102, a central housing 104, and a front door 106. The rear door 102 is configured to be mounted to a support, such as a wall, and remains stationery with respect to the support. The central housing 104 is rotatably connected to the rear door 102 and is configured to contain utility components, such as cable organizers and patch panels. Movement of the central housing 104 with respect to the rear door 102 provides access to the rear, or incoming portion, of the patch panels. The front door 106 is rotatably connected to the central housing 104. The front door 106 provides access to the front, or outgoing portion, of the patch panels.

The rear door 102 includes a rear wall 110, a top wall 112, a bottom wall 114, and a pair of side walls 116, 118 that define a rear door interior cavity. The rear wall no includes one or more mounting features 120 that allow the rear door 102 to be mounted to a wall or other support structure. The mounting features 120 are illustrated as openings that can be aligned with anchors positioned in a wall and receive fasteners. The rear wall no can also include one or more knockouts 122. The knockouts 122 can be selectively removed as needed so that cables can be routed through the rear wall no into the interior cavity. Similarly the top wall 112 and the bottom wall 114 can include one or more knock-outs 124, 126 so that cables can be selectively routed through the top or bottom wall.

The central housing 104 includes a top wall 130, a bottom wall 132, and a pair of side walls 134, 136 that define a central housing interior cavity. The central housing 104 includes a front opening 138 and a rear opening 140. A frame 142 is positioned inside of and fixed to the central housing 104. The frame 142 is used to support one or more utility components, for example racks, trays, or shelves used to support patch panels and cable management components (not shown). The patch panels have an incoming portion facing the rear door and an outgoing portion facing the front door.

The central housing 104 is rotatably connected to the rear door 102 through one or more rear hinge assemblies 150. A rear lock assembly 152 can be provided to secure the central housing 104 to the rear door 102. The front door 106 is rotatably connected to the central housing 104 through one or more front hinge assemblies 154. A front lock assembly 156 can be provided to secure the front door 106 to the central housing 104.

In use, the rear door 102 is connected to a support structure such as a wall, and one or more utility cables are routed through the rear door 102 into the interior cavity. The utility cables can then be connected to components in the central housing 104, such a patch panels. The cables can be hardwired to the incoming portion of the patch panels. The patch panels can include modular connector jacks (RJ11, RJ45, etc.) on the outgoing portion that allow cables to be easily connected to the patch panel. The front door 106 is used to access the outgoing portion of the patch panels. When access to the incoming portion of the patch panels is needed, the user rotates the central housing 104 away from the rear door 102.

Housing the utility components in the central housing 104 requires that both the central housing 104 and the rear door 102 be strong enough to support the weight of the components and the cables connected thereto. Accordingly, the rear hinge assembly 150 must also be robust enough to support the weight and movement of the central housing 104. When the utility cabinet is positioned in an outdoor location or a harsh environment, such as in industrial or wet locations, multiple special gaskets are needed to seal the front and rear openings of the central housing to prevent the ingress of moisture or debris.

FIGS. 3-7 show an exemplary embodiment of a wall mounted utility cabinet 200 that overcomes the above-identified disadvantages. The cabinet 200 includes a housing 202 having a pair of side openings 204, 206 and a front opening 208. A front door 210 and a pair of side doors 212, 214 are connected to the housing 202 to cover and permit access to the respective openings 204, 206, 208. The housing 202 is configured to be mounted to a support, such as a wall or interior framing, and remains stationery with respect to the support. The housing 202 is also configured to contain utility components 216, such as cable organizers and patch panels. The side doors 212, 214 are rotatably connected to the housing 202 and provide access to the rear, or incoming portion 218, of the patch panels. The front door 210 is rotatably connected to the housing 202 and provides access to the front, or outgoing portion 220, of the patch panels.

The housing 202 includes a rear wall 222, a top wall 224, a bottom wall 226, and a pair of side walls 228, 230 that define an interior cavity. The rear wall 222 includes one or more mounting features that allow the housing 202 to be mounted to a wall or other support. The mounting features are illustrated as an upper tab 232 extending above the top wall and a lower tab 234 extending below the bottom wall. The upper tab 232 and lower tab 234 include openings that receive a respective bracket 236 (bottom bracket not shown). The bracket 236 can be fixed to the wall and the housing 202 is releasably connected to the bracket 236. Additional fasteners (not shown) can be used to secure the housing 202 to the wall.

Figure 3:
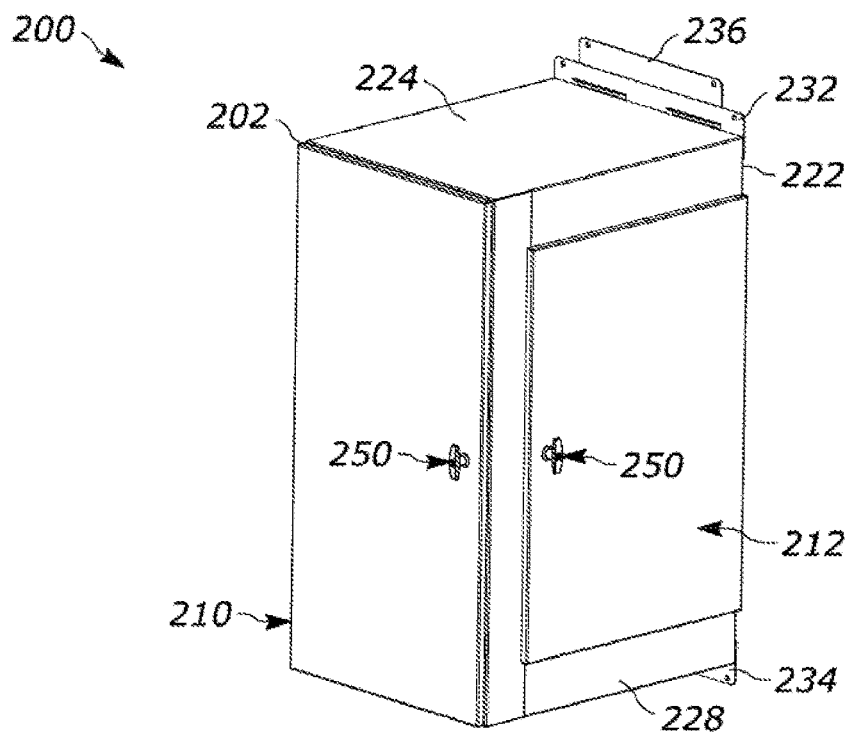
FIG. 3 is a perspective view of an exemplary wall mounted utility cabinet.
Figure 4:
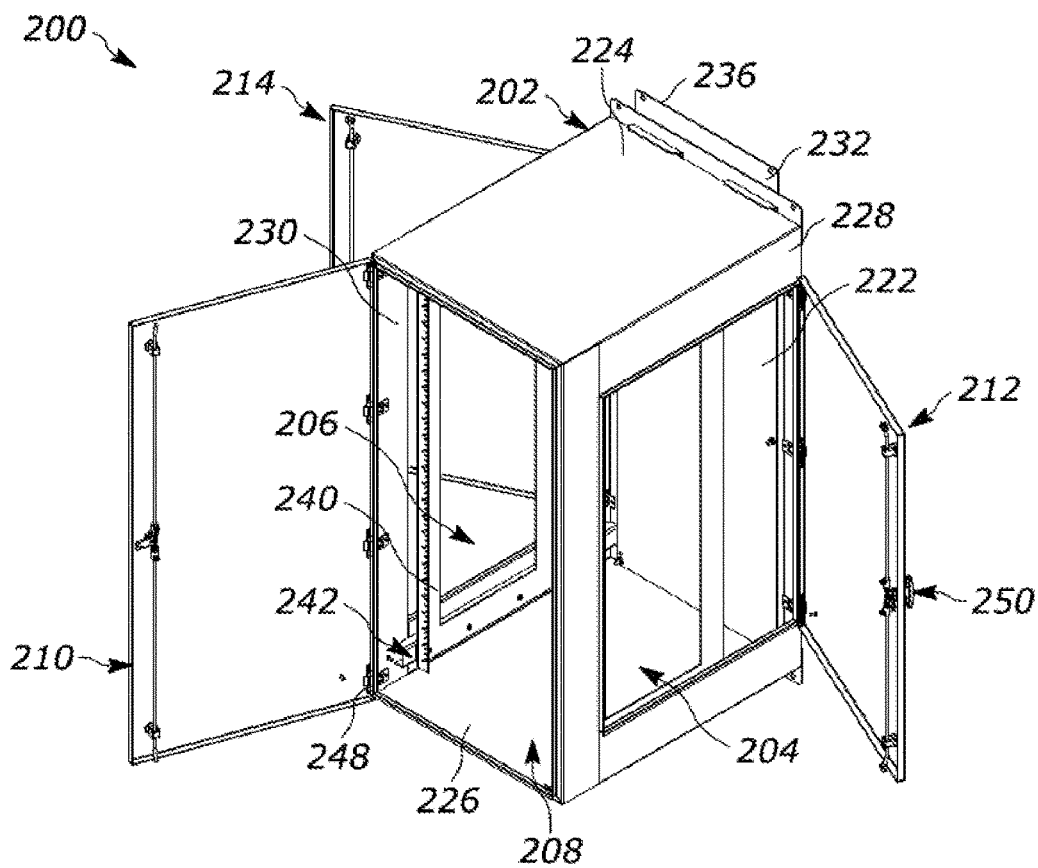
FIG. 4 shows the cabinet of FIG. 3 with the doors in an open position.
Figure 5:
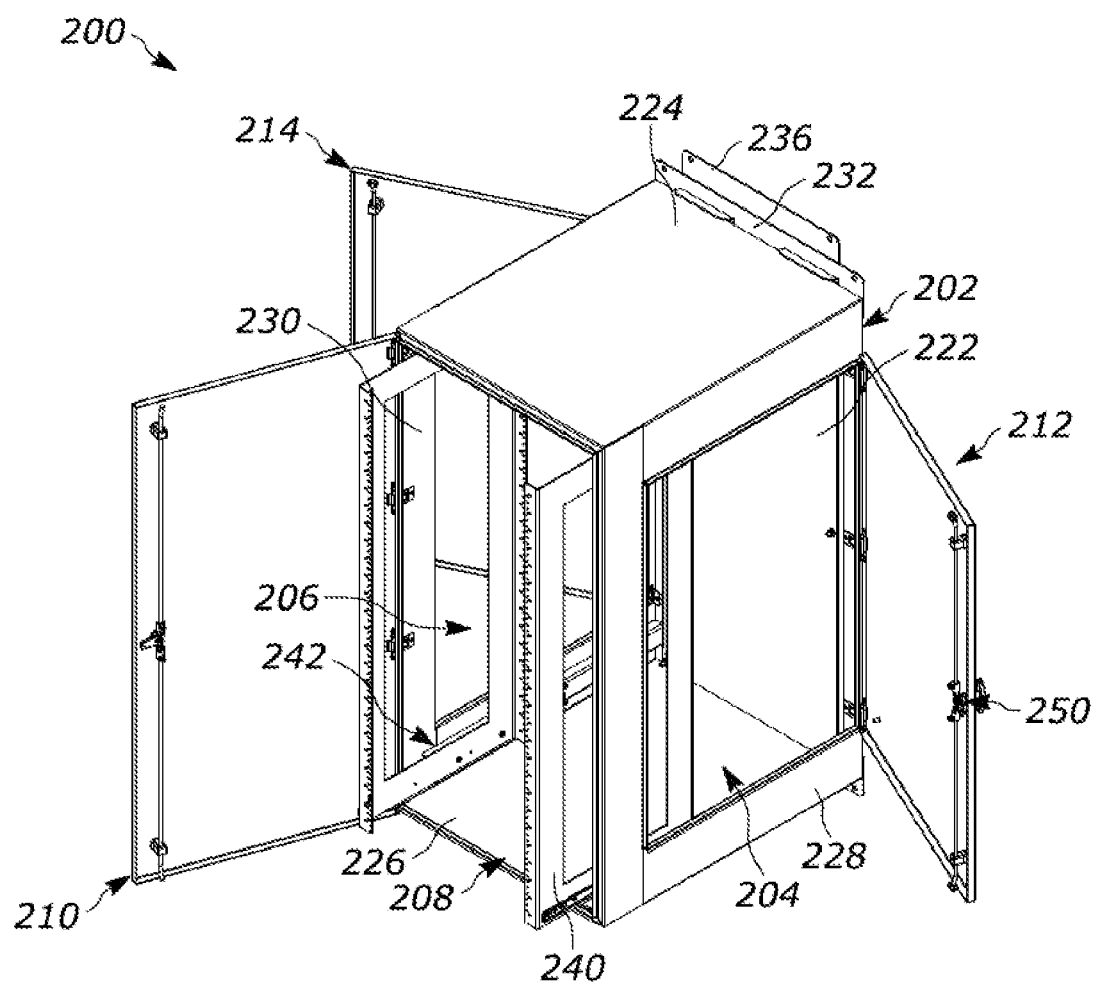
FIG. 5 shows the cabinet of FIG. 3 with the doors in an open position and the frame extending from the housing.
Figure 6:
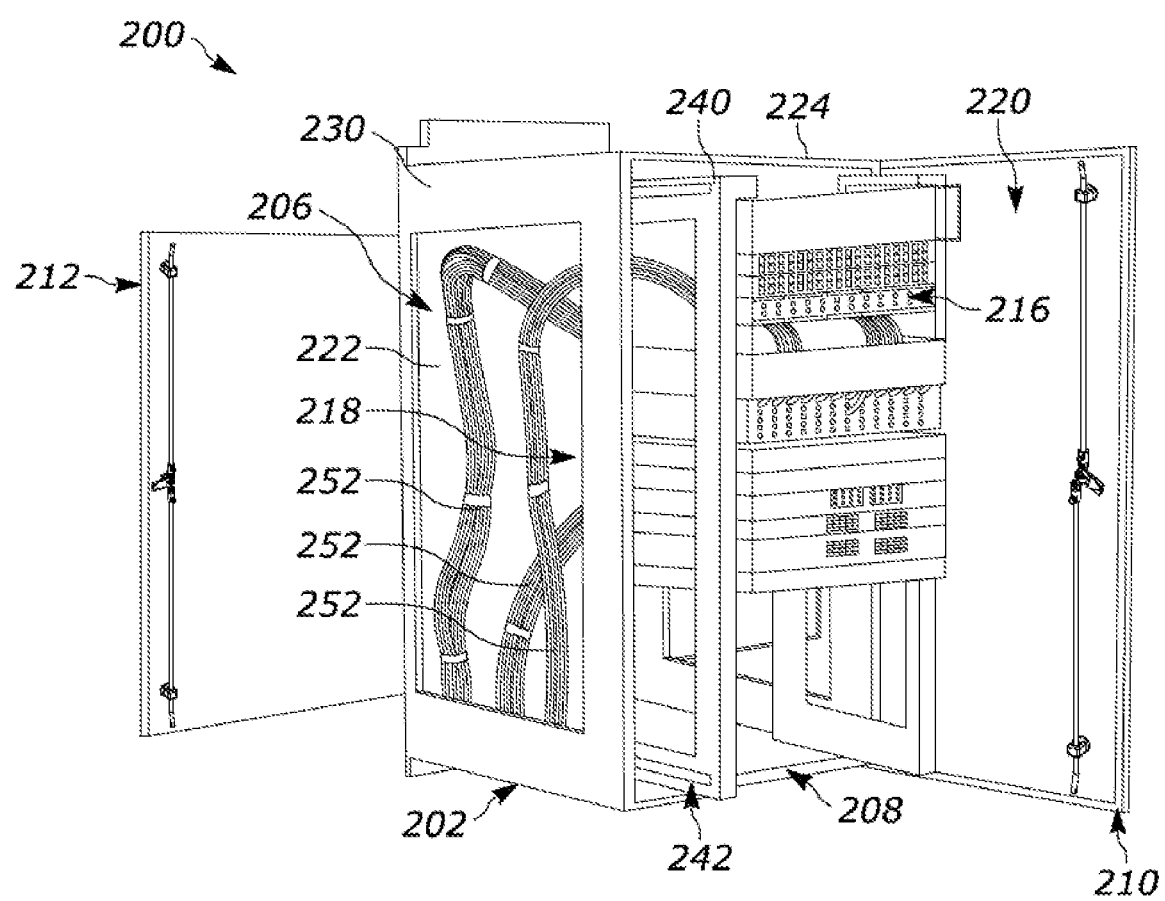
FIG. 6 is a perspective view of the cabinet of FIG. 3 with the doors in an open position and utility components and cabling connected to the frame.
Figure 7:
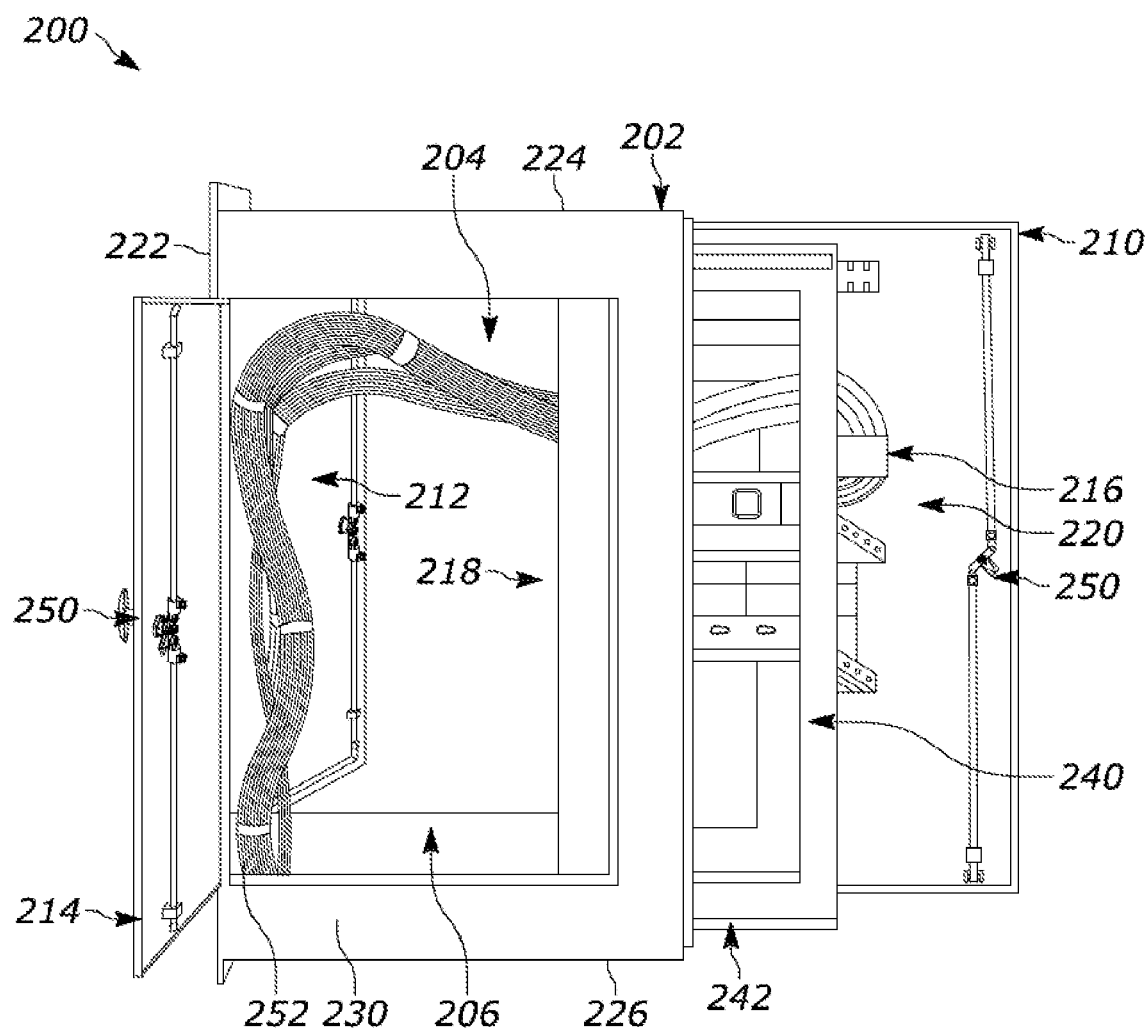
FIG. 7 is a side view of FIG. 6.

A frame 240 is moveably connected to the housing 202. The frame 240 can be moved between a first position where the frame 240 is entirely in the housing (as shown in FIGS. 3 and 4) to a second position where at least a portion of the frame 240 is positioned outside of the housing 202 (as shown in FIGS. 5-7). In some embodiments, at least half of the frame 240 can be positioned outside of the housing 202 in the second position. In an exemplary embodiment, on or more glide assemblies 242 having a track and a slider connects each side of the frame 240 to the housing 202. The illustrated embodiment uses four glide assemblies 242 (top and bottom of each side) to support the frame 240 as it moves. The frame 240 is used to support one or more utility components 216, for example racks, trays, or shelves used to support patch panels and cable management components. As shown in FIGS. 6 and 7, the patch panels have an incoming portion 218 facing the rear wall and an outgoing portion 220 facing the front door 210. One or more knockouts or other openings (not shown) can be provided in the rear wall 222, top wall 224, and bottom wall 226 to allow for cables to be routed into the housing 202.

The front door 210 and each of the side doors 212, 214 are connected to the housing 202 through on or more hinge assemblies 248. A latch assembly 250 is used to secure the doors 210, 212, 214 to the housing 202 in a closed position. In an exemplary embodiment, each latch assembly 250 includes a knob connected to a pair of rods through a transfer mechanism. Rotation of the knob causes lateral movement of the rods in opposite directions, allowing the rods to engage or disengage an interior portion of the housing 202. Other types of latch assemblies and lock assemblies can also be used.

In use, the housing 202 is connected to a support structure such as a wall, and one or more utility cables 252 are routed into the housing 202. The utility cables 252 can then be connected to components in the housing 202, such as patch panels. The cables 252 can be hardwired to the incoming portion 218 of the patch panels. The patch panels can include modular connector jacks (RJ11, RJ45, etc.), on the outgoing portion 220 that allow user cables to be easily connected to the patch panel. The front door 210 is used to access the outgoing portion 220 of the patch panels. When access to the incoming portion 218 of the patch panels is needed, the user can open one or more of the side doors 212, 214 and slide the frame 240 out of the housing.

In various exemplary embodiments, the size and shape of the utility cabinet 200 can be modified based on desired use and location. In certain embodiments, only a single side door can be provided. Other access openings can also be included in the housing.

The foregoing detailed description of the certain exemplary embodiments has been provided for the purpose of explaining the general principles and practical application, thereby enabling others skilled in the art to understand the disclosure for various embodiments and with various modifications as are suited to the particular use contemplated. This description is not necessarily intended to be exhaustive or to limit the disclosure to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present disclosure, and are not intended to limit the structure of the exemplary embodiments of the present disclosure to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. A utility cabinet comprising:
a housing having an interior compartment, a front opening, and a side opening, wherein the housing is configured to be connected to a support;
a frame positioned in the interior compartment and translatably moveable with respect to the housing;
a first opening providing access to the interior compartment; and
a second opening providing access to the interior compartment,
wherein the frame is configured to receive a cable manager that includes a first portion accessible through the first opening and a second portion accessible through the second opening.

2. The utility cabinet of claim 1, wherein the frame is slidably connected to the housing with a glide assembly.

3. The utility cabinet of claim 2, wherein the glide assembly includes a track and a slider.

4. The utility cabinet of claim 1, further comprising a second side opening.

5. The utility cabinet of claim 1, wherein the housing includes a rear wall configured to be connected to a support.

6. The utility cabinet of claim 5, wherein the rear wall includes a mounting tab.

7. The utility cabinet of claim 1, wherein a door is connected to the housing and moveable over at least one of the openings.

8. A utility cabinet comprising: a housing having an interior compartment and a first opening providing access to the interior compartment, wherein the housing is configured to be connected to a support; a frame connected to the housing and translatable so that at least a portion of the frame is moved through the first opening; and a cable manager connected to the frame, the cable manager having a first portion including a first set of connections and a second portion having a second set of connections.

9. The utility cabinet of claim 8, wherein the housing includes a second opening and a third opening.

10. The utility cabinet of claim 9, wherein the cable manager is accessible to a user through the second opening.

11. The utility cabinet of claim 9, further comprising a first door connected to the housing and moveable between a closed position covering the first opening and an open position providing access to the first opening, a second door connected to the housing and moveable between a closed position covering the second opening and an open position providing access to the second opening, and a third door connected to the housing and moveable between a closed position covering the third opening and an open position providing access to the third opening.

12. The utility cabinet of claim 11, further comprising a latch assembly connected to the first door and configured to secure the first door in the closed position.

13. The utility cabinet of claim 8, wherein the frame is slidably connected to the housing with a glide assembly.

14. The utility cabinet of claim 8, wherein the cable manager first portion is configured to receive one or more cables and the cable manager second portion includes one or more connector jacks.

15. The utility cabinet of claim 8, wherein the housing includes a rear wall having a mounting tab.

16. A utility cabinet comprising:
a housing having an interior compartment, a rear wall, a top wall, a bottom wall, a first side wall, a second side wall, a front opening, and a side opening positioned in at least one of the side walls, wherein the housing is configured to be connected to a support structure;
a frame connected to the housing and translatable toward and away from the rear wall, wherein the frame is configured to receive one or more utility components;
a front door connected to the housing and moveable between a closed position covering the front opening and an open position providing access to the front opening.

17. The utility cabinet of claim 16, wherein the frame is slidably connected to the housing with a glide assembly.

18. The utility cabinet of claim 16, wherein the one or more utility components includes a patch panel connected to the frame, the patch panel having an outgoing portion facing the front opening and an incoming portion positioned opposite the outgoing portion.

19. The utility cabinet of claim 16, wherein the front door is rotatably connected to the housing.

20. The utility cabinet of claim 19, further comprising a latch assembly connected to the front door and configured to secure the front door in the closed position.

* * * * *